United States Patent [19]
Bothra et al.

[11] Patent Number: 5,618,757
[45] Date of Patent: Apr. 8, 1997

[54] METHOD FOR IMPROVING THE MANUFACTURABILITY OF THE SPIN-ON GLASS ETCHBACK PROCESS

[75] Inventors: Subhas Bothra; Milind G. Weling, both of San Jose, Calif.

[73] Assignee: VLSI Technology, Inc., San Jose, Calif.

[21] Appl. No.: 593,898

[22] Filed: Jan. 30, 1996

[51] Int. Cl.[6] .................. H01L 21/302; H01L 21/304; H01L 21/463

[52] U.S. Cl. .................. 438/699; 438/631; 438/941; 438/926

[58] Field of Search .................. 437/195, 190, 437/225, 231

[56] References Cited

U.S. PATENT DOCUMENTS

| | | | |
|---|---|---|---|
| 4,916,514 | 4/1990 | Nowak | 357/68 |
| 5,470,802 | 11/1995 | Gnade et al. | 437/195 |
| 5,476,817 | 12/1995 | Numata | 437/195 |
| 5,488,015 | 1/1996 | Havemann et al. | 437/195 |
| 5,510,293 | 4/1996 | Numata | 437/195 |

OTHER PUBLICATIONS

Ichikawa, et al., "Multilevel Interconnect System for 0.35 um CMOS Lsi's with Metal Dummy Planarization Process and Thin Tungsten Wirings", Jun. 27–29, 1995 VMIC Conference, 1995 ISMIC—104/95/0254.

Primary Examiner—Charles L. Bowers, Jr.
Assistant Examiner—Lynne A. Gurley
Attorney, Agent, or Firm—Hickman Beyer & Weaver

[57] ABSTRACT

Spin-on glass etchback is a technique commonly used to planarize the surface of a semiconductor wafer during fabrication. The etch rate of spin-on glass is largely affected by the amount of oxide exposed during the spin-on glass etchback process. The amount of oxide exposed during spin-on glass etchback is dependent upon the underlying pattern density of topography. A method of standardizing the pattern density of topography for different layers of semiconductor wafers to improve the spin-on glass etchback process used to planarize the surface of a wafer during processing is disclosed. In order to achieve a standardized pattern density of topography on the surface of a wafer, dummy raised areas are added into gaps between active conductive traces on a trace layer. In some embodiments, the standardized pattern density is in the range of approximately 40% to 80%. In some applications, both the active conductive traces and the dummy raised areas are formed from a metallic material that is deposited in one single step with an oxide layer deposited over both the active conductive traces and the dummy raised areas prior to the application of spin-on glass and the spin-on glass etchback process. In other applications, the dummy raised areas are formed from an oxide material.

12 Claims, 5 Drawing Sheets

METHOD FOR IMPROVING THE MANUFACTURABILITY OF THE SPIN-ON GLASS ETCHBACK PROCESS

CROSS REFERENCE TO RELATED APPLICATION

Co-pending U.S. patent application Ser. Nos. 08/593,900 filed Jan. 30, 1996, 08/579,605 filed Dec. 26, 1995, and 08/594,874 filed Jan. 31, 1996, and provisional U.S. patent application Ser. No. 60/015,579 filed Apr. 18, 1996, are all related to the present application.

BACKGROUND OF THE INVENTION

1. Field of Invention

The present invention relates generally to a method of fabricating an integrated circuit. More particularly the use of dummy lines to commonize the percentage of raised areas exposed during a spin-on glass etchback process is disclosed to reduce variations in the spin-on glass etchback process during fabrication.

2. Description of the Prior Art

Maintaining the planarity of a semiconductor wafer surface during the process of multilevel metallization is crucial to insure that there is no accidental coupling of active conductive traces between different layers of active conductive traces on integrated circuits housed on the wafer, and further to provide a surface with a constant height for any subsequent lithography processes. There are many processes which are intended to improve the planarity of a wafer surface during fabrication.

Spin-on glass (SOG) etchback is one process commonly used to improve the local planarity of a semiconductor wafer surface during the process of multilevel metallization. In the SOG etchback process, a layer of SOG is deposited over an insulating layer on the surface of a semiconductor wafer in order to fill in any gaps between metal lines on a trace layer of the wafer. Filling in the gaps between metal lines with SOG results in a planar surface on the wafer. The SOG layer is then etched back to remove all of the SOG over underlying metal lines where vias could be placed. The effectiveness of SOG etchback is dependent on the underlying pattern of metal lines and spaces on the surface of a semiconductor wafer.

FIGS. 1 and 2 are diagrammatic side views of a semiconductor wafer substrate 100 on which metal lines 112, 114, 116 are situated on a trace layer 120. The metal lines 112, 114, 116 are typically active conductive traces. In FIG. 1, an oxide layer 118 is deposited over the metal lines 112, 114, 116. The portions of the oxide layer 118 directly over the metal lines 112, 114, 116 appear raised with respect to the portions of the oxide layer 118 that do not directly overlie the metal lines 112, 114, 116 and are referred to herein as raised oxide areas 122. A layer of SOG 130 is then deposited over the oxide layer 118. FIG. 2 shows the surface of the substrate 100 after a SOG etchback process has occurred. The SOG layer 130 has been etched back to expose portions of the oxide layer 118 over the metal lines 112, 114, 116.

The local planarity of a semiconductor wafer surface has been observed to be very sensitive to the amount of SOG etched back during the SOG etchback process. For Application Specific Integrated Circuit (ASIC) products, the density of metal lines commonly varies from level to level on a single integrated circuit, as well as from product to product. This variation impacts the amount of the insulating layer, which is typically an oxide layer, exposed during SOG etchback, resulting in a variation in the micro-loading during etch. The micro-loading during etch is best described as the enhancement of the SOG etch rate which occurs when oxide exposed during the SOG etchback process affects the etch rate of the SOG adjacent to it. If the pattern density of the topography on a layer of a semiconductor wafer is uneven, the SOG and the oxide may be etched at different rates, thereby causing variations in the micro-loading during etch. Variations in the micro-loading during etch may result in wide variations in the planarity of a layer of a semiconductor wafer. It follows that the micro-loading during etch for layers of wafers with different pattern densities of topography will almost certainly not be the same.

In order to reduce variations in the micro-loading during etch, the SOG etchback process is occasionally modified before each layer of each product undergoes the process. By way of example, the gas flows and the amount of chemicals used during the SOG etchback process may be altered for each layer which is subjected to a SOG etchback process. From a manufacturability standpoint, however, changing the SOG etchback process for each product is far from ideal as it is both time-consuming and expensive.

While the use of a SOG coating and a SOG etchback process have been shown to be effective in improving the local planarity of the surface of a semiconductor wafer during fabrication, the development of an efficient, inexpensive method which would enable a common SOG etchback process to be used for an array of semiconductor products, without compromising the planarity of any of the layers on any of the products, is desirable.

SUMMARY OF THE INVENTION

To achieve the foregoing and other objects and in accordance with the purpose of the present invention, dummy raised lines are added to integrated circuits in order to maintain a predetermined consistent density of raised lines from layer to layer on a single integrated circuit, and from product to product. More specifically, in a method aspect of the invention, an active trace layer is created by forming a multiplicity of active conductive traces on a substrate of the wafer. The respective active conductive traces are arranged to electrically couple associated elements on the wafer when the processing is completed. The active conductive traces are arranged such that there are gaps between adjacent ones of the traces. A multiplicity of dummy raised lines are also formed on the substrate in at least some of the gaps in order to increase the pattern density of topography on the substrate of a wafer to meet a predetermined standardized pattern density. The dummy raised lines differ from the active conductive traces in that they are not arranged to electrically couple any elements on the wafer and they are arranged in a predefined pattern with respect to the wafer. In some preferred embodiments the dummy raised lines are formed from the same material as the active conductive traces and are laid down at the same time as the active conductive traces. The dummy raised lines may be formed from a multiplicity of blocks or line segments of different shapes and sizes. Alternatively, they may be formed from a multiplicity of dots or other suitable geometries.

After the active conductive traces have been laid, an oxide layer is deposited over the active conductive traces to electrically insulate the active conductive traces. If dummy raised lines are laid down at the same time as the active conductive traces, the oxide layer is clearly deposited over the dummy raised lines as well. The portions of the oxide layer which overlie the active conductive traces and the dummy raised lines form areas of raised oxide. A layer of glass is then spun over the oxide layer to provide a planar surface on the wafer. With this arrangement, the glass layer is superimposed over the active conductive traces and the dummy raised lines. After the glass layer has been spun into place, it is etched to expose at least portions; of the oxide layer over the active conductive traces and the dummy raised lines to permit the formation of vias between the trace layer and elements superimposed above the oxide layer when further processing is done on the wafer. The rate at which the SOG is etched is generally enhanced by the exposure of raised oxide areas. Specifically, exposed oxide areas enhance the rate at which the SOG directly adjacent to the exposed oxide areas is etched. By adding raised oxide areas, the enhancement, known as micro-loading during etch, may be optimized when the additional raised oxide areas aid in achieving a uniform rate in the SOG etchback process.

In a first preferred embodiment, the aforementioned predetermined standardized pattern density of topography is a set value in the range of approximately 40% to 80%, as for example 50%, of the overall surface area of a semiconductor wafer. In a method relating to the first embodiment, both the active conductive traces and the dummy raised lines are formed from a metallic material that is deposited in one single step with the oxide layer being deposited over both the conductive traces and the dummy raised lines. In a second embodiment, the dummy raised lines may be formed from an oxide material using a masking technique. Integrated circuits formed using such techniques are also described.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1:
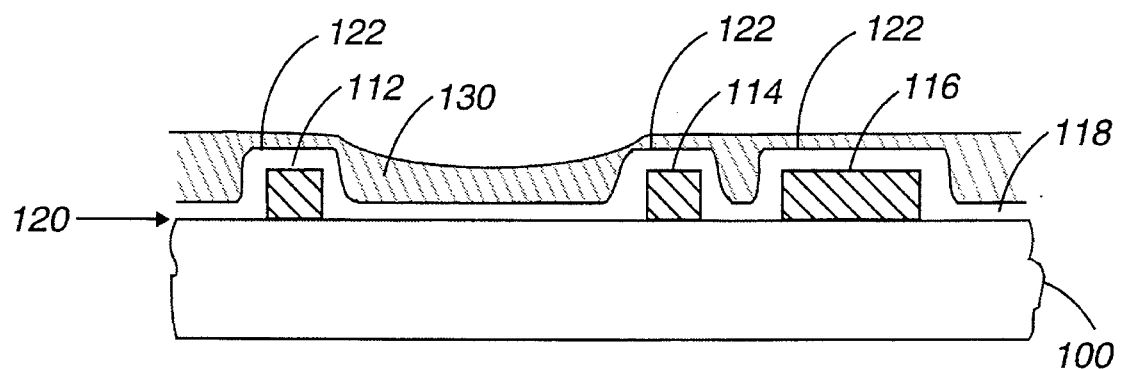
FIG. 1 is a diagrammatic side view of a wafer segment illustrating the conventional spin-on glass application.
Figure 2:
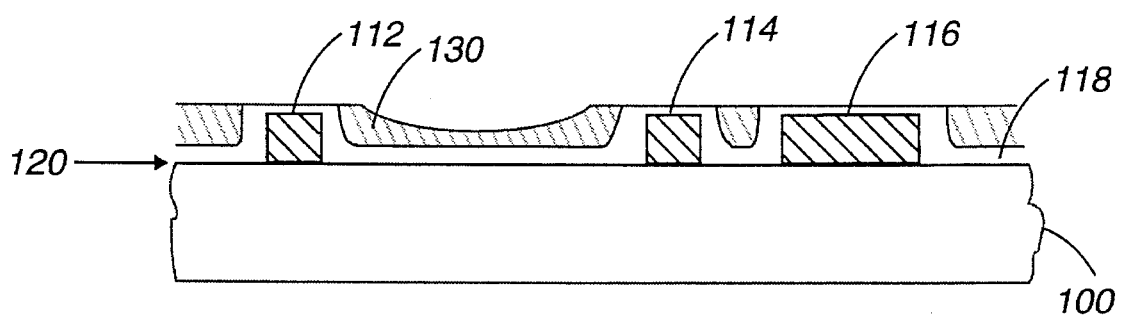
FIG. 2 is a diagrammatic side view of a wafer segment illustrating the conventional spin-on glass etchback.
Figure 3:
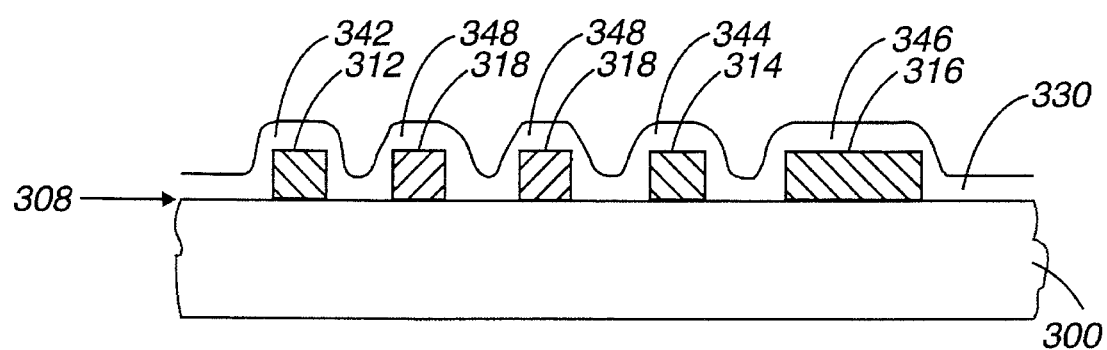
FIG. 3 is a diagrammatic side view of a wafer segment with dummy metal lines, after an oxide layer is added, in accordance with a first preferred embodiment of the present invention.

The present invention will now be described in detail with reference to a few preferred embodiments thereof as illustrated in the accompanying drawings. As is common in the prior art, the pattern density of metal traces will vary greatly in accordance with the needs of a particular design. It follows that the pattern density of raised oxide areas, or the portions of the oxide layer which are directly over metal traces, will also vary greatly from design to design. Referring initially to FIG. 3, there is shown a substrate 300 with a plurality of active conductive traces 312, 314, 316 situated on the active trace layer 308 of the substrate 300. An oxide layer 330 is deposited over the active conductive traces 312, 314, 316 in order to insulate the active conductive traces 312, 314, 316. Raised oxide areas 342, 344, 345 are created over the active conductive traces 312, 314, 316, respectively.

A spin-on glass (SOG) etchback process is commonly used to achieve planarity on the surface of a semiconductor wafer. The process involves spinning a layer of glass onto the surface of a wafer to planarize the surface. The SOG layer is then etched back to the nominal thickness of the SOG in order to remove all of the SOG over underlying active conductive traces. Removing SOG from over the active conductive traces enables vias to be formed.

It has been observed that the effectiveness of SOG etchback is dependent upon the underlying pattern of metal lines and spaces on the surface of an integrated circuit. Specifically, the rate of SOG etchback is dependent upon the amount of oxide exposed during the process, due to the fact that there is an effect, known as micro-loading during etch, which is observed during SOG etchback. The micro-loading during etch is best described as the enhancement of the SOG etch rate which occurs when the oxide exposed during the SOG etchback process affects the etch rate of the SOG adjacent to it. The exposed oxide affects the etch rate when it combines with the plasma used in the SOG etchback process, thereby altering the chemical composition of the plasma. Since it is desirable to etch the SOG and the oxide at approximately the same rate in order to maintain planarity, dummy raised lines which create additional raised oxide areas are added to trace layers of a semiconductor wafer in order to achieve a standardized predetermined pattern density on the surface of the wafer.

Achieving a standardized predetermined pattern density on a plurality of layers of a single semiconductor wafer provides the means for better control over the SOG etch rates since exposing a consistent surface area of oxide during SOG etchback on every layer enables the effect of micro-loading during etch to be approximately the same for all layers. Similarly, achieving a standardized predetermined pattern density on a plurality of layers for different integrated circuits also allows for better control over the SOG etchback process, thereby enabling a more standardized SOG etchback step to be implemented into the overall wafer fabrication process. It may even be desirable to implement a fixed set of SOG etchback processes which correspond to a fixed set of a few standardized pattern densities. A fixed set of a few standardized pattern densities may be necessary as, for example, some products may have capacitance requirements which may be compromised with the addition of dummy raised lines, while other products may already have extremely high pattern densities. A fixed set of a few standardized pattern densities, and, therefore, a fixed set of SOG etchback processes, would accommodate an array of products, without compromising the planarity of any of the products.

In the segment of the embodiment shown in FIG. 3, dummy raised lines 318 are added to the active trace layer 308 in regions where additional raised oxide areas are desired. Both the surface area of the dummy raised lines 318 and the location of the dummy raised lines 318 will vary widely in accordance with the desired overall area of raised oxide. The desired overall area of raised oxide is dependent upon the predetermined percentage of pattern density required. In this embodiment, the predetermined standardized pattern density, or the percentage of raised oxide areas, is a set value in the range of approximately 40% to 80%, as for example 50%, of the overall surface area of a wafer. The active conductive traces may be formed from any suitable material, but are typically a metallic material such as an aluminum alloy or a copper alloy. In the embodiment shown, the dummy raised lines are formed from the same material as the active conductive traces and are applied in the same step to minimize processing. The dummy raised lines differ from the active conductive traces primarily in that they are not used to electrically couple other elements in the integrated circuit.

Figure 4A:
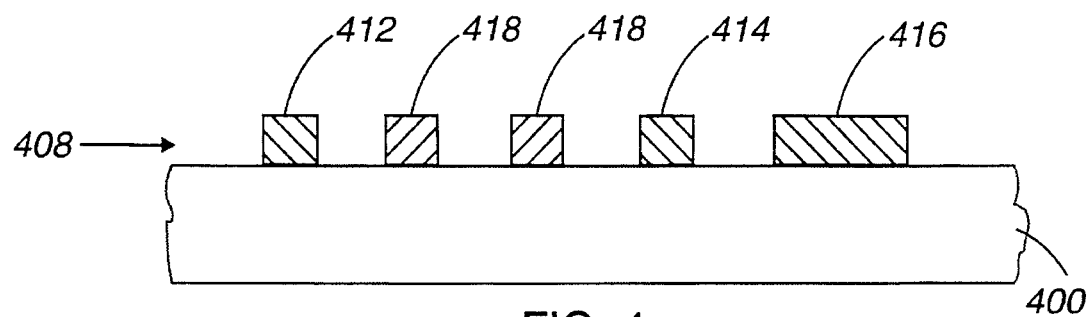
FIGS. 4a–d are diagrammatic side views of a wafer segment which illustrate the steps in creating a uniform surface on a semiconductor wafer using dummy raised lines created from metal in accordance with the first preferred embodiment of the present invention.

Referring next to FIGS. 4a through 4d, a method of forming the dummy raised lines illustrated in FIG. 3 will be described. FIGS. 4a through 4d are diagrammatic side views of a wafer segment on which dummy raised lines are situated on the same layers as active conductive traces. In this method, dummy raised lines 418 are inserted in gaps between active conductive traces 412, 414, 416 on the trace layer 408 of a semiconductor substrate 400 as illustrated in FIG. 4a. The number of dummy raised lines 418 inserted, and therefore the total surface area of the dummy raised lines 418 inserted, is dependent upon the amount of raised, subsequently exposed, oxide areas desired. In this embodiment, the predetermined standardized pattern density, i.e. the percentage of exposed oxide areas desired, is in the range of approximately 40% to 80% of the overall surface area of the substrate 400. Accordingly, the total surface area of the dummy raised lines 418 added reflects the desired percentage of pattern density. The material from which the dummy raised lines 418 are formed was previously described with respect to FIG. 3. In some variations of this method, dummy raised lines 418 may be formed from a multiplicity of blocks or line segments. In others, dummy raised lines 418 may be formed from a multiplicity of dots or any other suitable geometry or pattern. The width and the length of the dummy raised lines 418 are determined by the size of the gaps between the active conductive traces 412, 414, 416 and the predetermined standardized pattern density.

Figure 4B:
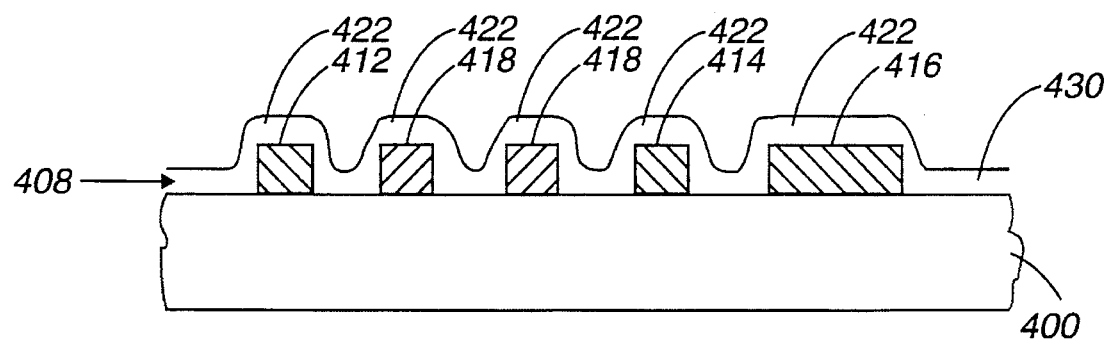

An oxide layer 430 is deposited over the dummy raised lines 418 and the active conductive traces 412, 414, 416 as illustrated in FIG. 4b, in order to electrically insulate the active conductive traces 412, 414, 416. The portions of the oxide layer 430 directly over the dummy raised lines 418 and the active conductive traces 412, 414, 416 are the raised oxide areas 422 which are subsequently exposed during the SOG etchback process.

Figure 4C:
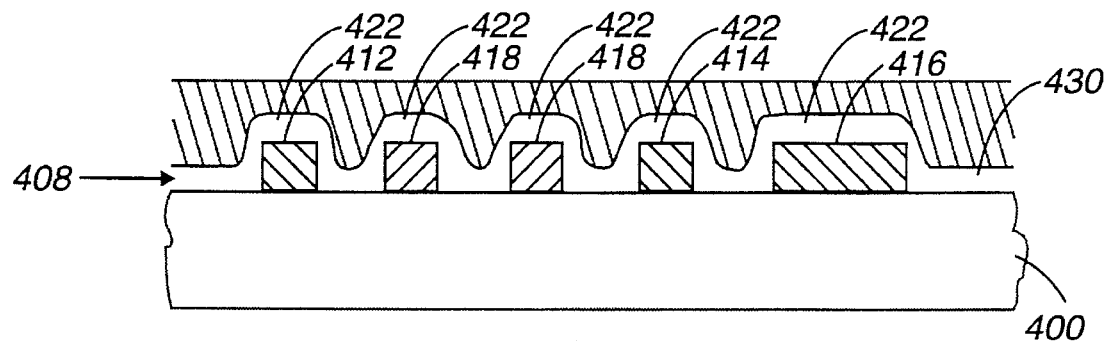
Figure 4D:
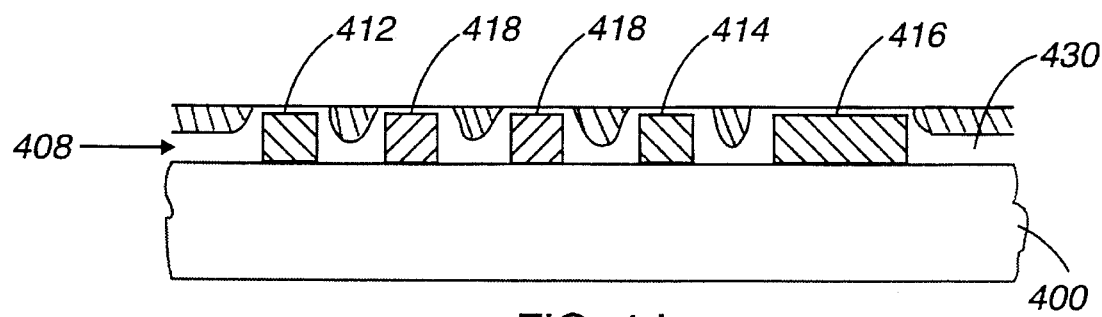

A layer of SOG 440 is deposited and spun over the oxide layer 430 to fill in gaps 420 between the dummy raised lines 418 and the active conductive traces 412, 414, 416 as illustrated in FIG. 4c. The layer of SOG 440 fills in the gaps 420 and creates a planar surface. After the layer of SOG 440 is deposited, the SOG layer 440 is etched back to expose the raised oxide areas 422, or the portions of the oxide layer 430 which are directly over the dummy raised lines 418 and the active conductive traces 412, 414, 416, as illustrated in FIG. 4d.

Figure 5A:
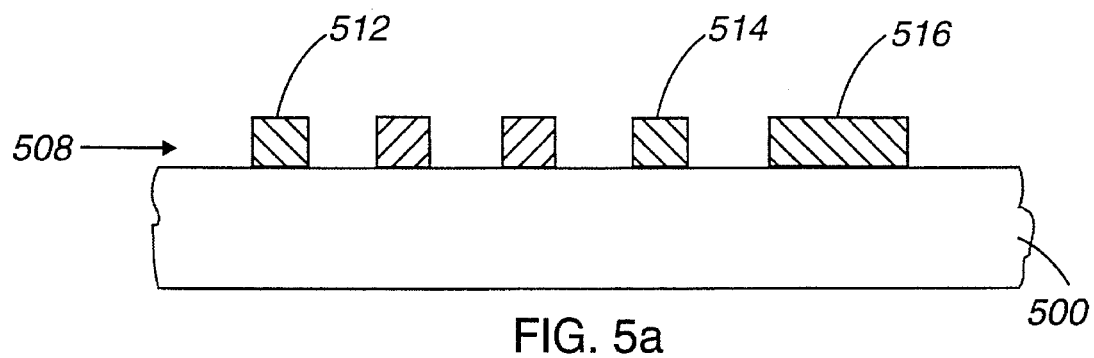
FIGS. 5a–f are diagrammatic side views of a wafer segment which illustrate the steps in creating a uniform surface on a semiconductor wafer using dummy raised lines created from an oxide layer in accordance with a second preferred embodiment of the present invention.
Figure 5B:
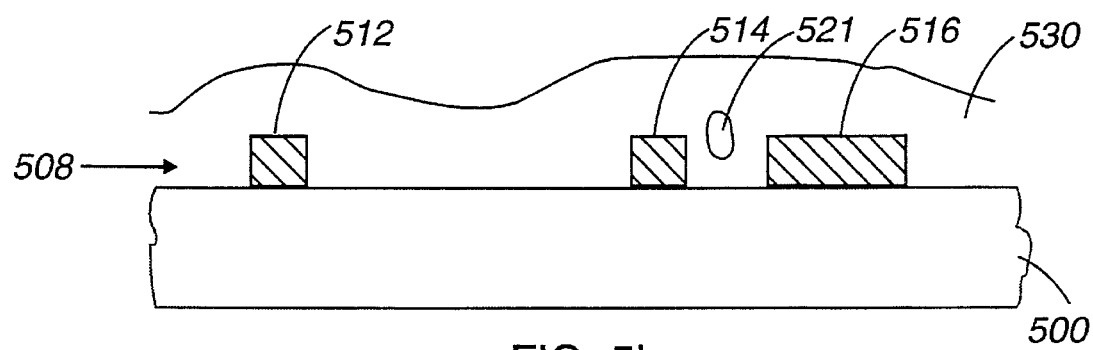
Figure 5C:
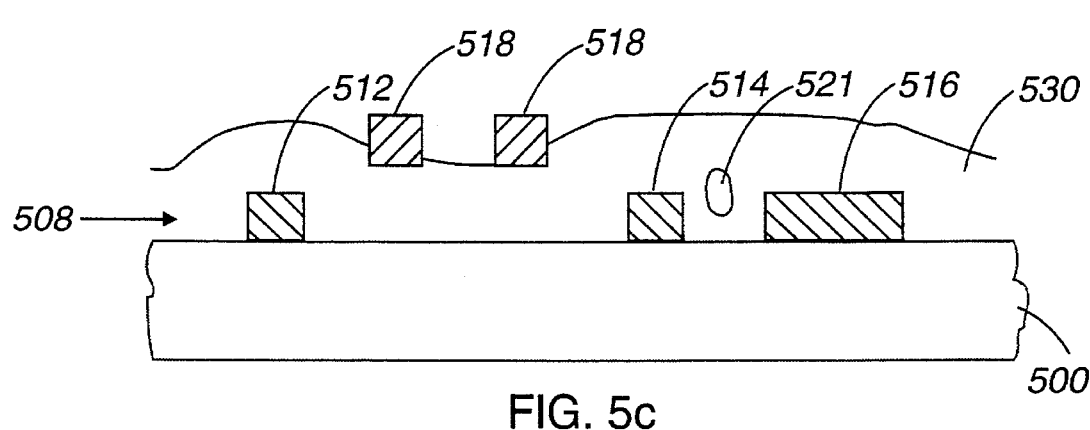
Figure 5D:
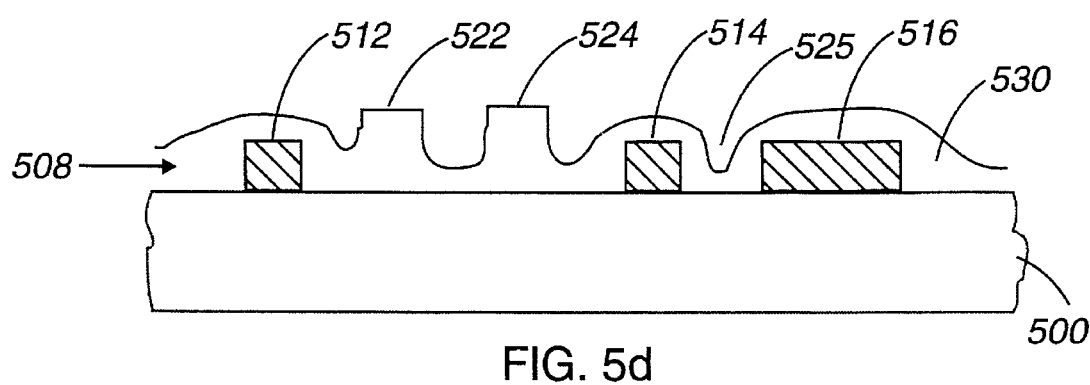

FIGS. 5a through 5e are diagrammatic side views of a second preferred embodiment of the present invention; this embodiment relates to a method for creating dummy raised lines in the oxide layer on the surface of art integrated circuit. In this embodiment, dummy raised lines are created first by depositing a thicker oxide layer 530 than normally used over active conductive traces 512, 514, 516 on the trace layer 508 situated on a semiconductor substrate 500, as illustrated in FIG. 5b. The oxide layer 530 should be thick enough to at least sufficiently fill in the gaps 519, 520 between the active conductive traces 512, 514, 516. Second, a mask 518, (created from a photoresist material in this embodiment) is placed over the oxide layer 530 in areas (such as gap 519 in the trace layer 508) where dummy raised lines are desired, as illustrated in FIG. 5c. The locations, as well as the number and total area, of dummy raised lines added is determined by the total area of exposed oxide desired after the subsequent SOG etchback process is complete. In this embodiment, the total area of exposed oxide desired is in the range of approximately 40% to 80% of the overall surface area of a semiconductor. Last, the oxide layer 530 is etched, and the mask 518 is removed, leaving dummy raised lines 522, 524 created from the oxide layer as illustrated in FIG. 5d. The dummy raised lines 522, 524 are created underneath where the mask 518 was placed, due to the fact that the mask prevents etching of the oxide layer 530 from occurring underneath it, while the remainder of the oxide layer 530 is etched. In some variations of this embodiment, dummy raised lines 522, 524 may be formed from a multiplicity of blocks or line segments. The width and the length of the blocks and the line segments depend upon the predetermined standardized pattern density and the size of the areas (such as gap 519 in the trace layer 508) where dummy raised lines 522, 524 are to be inserted. In other variations of this embodiment, dummy raised lines 522, 524 may be formed from a multiplicity of dots or any other suitable geometry or pattern.

Figure 5E:
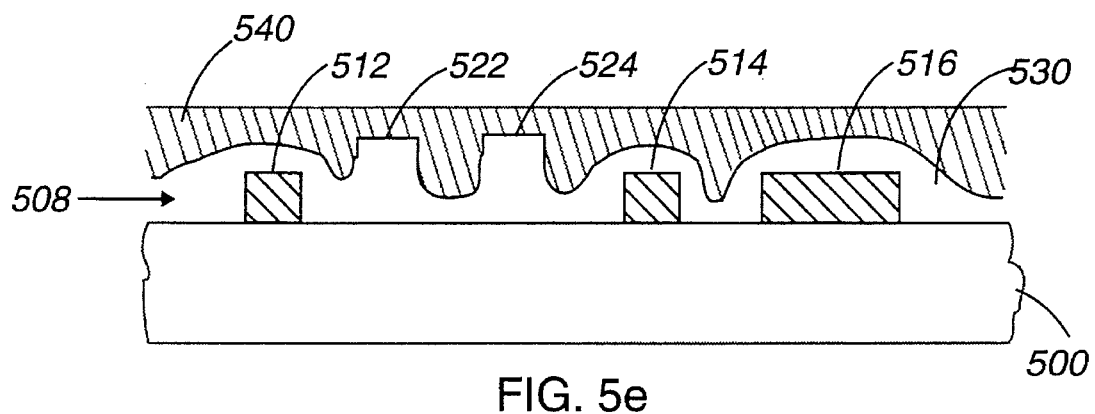
Figure 5F:
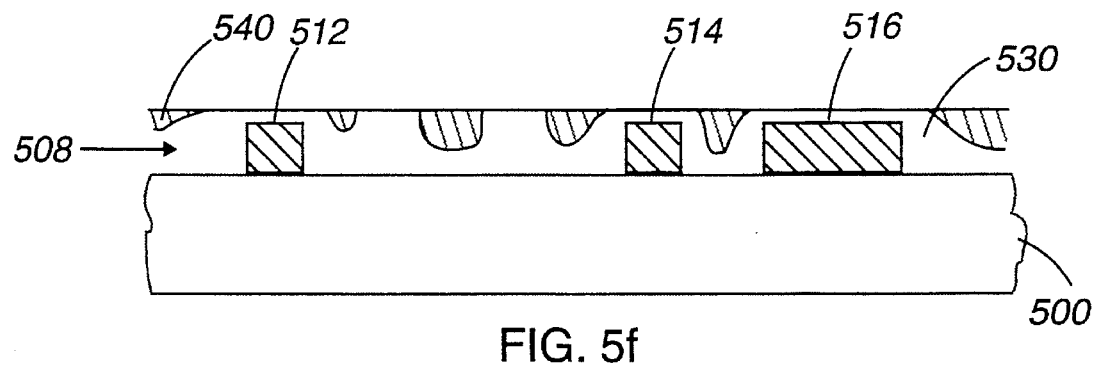

With the dummy raised lines 522, 524 in place, a layer of SOG 540 is deposited over the oxide layer 530 to create a planar surface as illustrated in FIG. 5e. After the layer of SOG 540 has been deposited, the SOG layer 540 is etched back to expose the portions of the oxide layer 530 directly over the dummy raised lines 522, 524 and the active conductive traces 512, 514, 516 as illustrated in FIG. 5f.

When a thick oxide layer 530 is deposited as shown if FIG. 5b, there is the possibility that a void (such as void 521) may form in the layer between closely spaced active conductive traces (such as active conductive traces 514 and 516). Any void (such as void 521) formed in the oxide layer 530 is exposed (void 525 is an exposed void) during the etching process of the oxide layer 530 as shown in FIG. 5d. Any exposed void (such as exposed void 525) is subsequently filled once a layer of SOG 540 has been deposited as shown in FIG. 5e.

Although only a few embodiments of the present invention have been described, it should be understood that the present invention may be embodied in many other specific forms without departing from the spirit or the scope of the invention. In particular, dummy raised lines may be implemented for use process which would benefit from additional raised surfaces on a semiconductor wafer. Also, although the predetermined standardized pattern density of raised oxide areas in the present invention is specified to be in the range of approximately 40% to 80%, as for example 50%, of the overall surface area of a wafer, the percentage can clearly be changed to meet the requirements of a particular system.

In the described embodiments, a predetermined standardized pattern density of the raised oxide heads is achieved for the plurality of layers on a single wafer (which may include a plurality of integrated circuits) as well as a plurality of layers on different wafers. This is achieved by adding dummy raised lines in appropriate places. It should be clear that dummy raised lines may be added to a single layer of a wafer in order to achieve a predetermined standardized pattern density of raised oxide areas on that layer alone as well. This type of approach facilitates matching the pattern densities between wafers which facilitates more standardization in wafer processes.

In the described embodiments, the dummy raised lines are formed from a multiplicity of dots, line segments, or blocks. However, it should be appreciated that the actual geometries of the dummy raised lines may be widely varied in accordance with the needs of a particular system. By way of example, it should be clear that any or all of the elements in the described embodiments may be used in combination. Similarly, other elements, such as a multiplicity of arcs, a multiplicity of "L-shaped" segments, or a multiplicity of criss-crossed segments, may be used for at least a portion of the dummy raised lines.

Neither the rate of SOG etchback, with or without the effect of micro-loading during etch, nor the rate at which oxide is etched has been specified, as the rates are not critical to the present invention. However, it should be clear that the rates may be specified to fulfill the requirements of a given system. Therefore, the present examples are to be considered as illustrative and not restrictive, and the invention is not to be limited to the details given herein, but may be modified within the scope of the appended claims.

We claim:

1. A method of fabricating an integrated circuit, the method comprising the steps of:
   a) forming a multiplicity of active conductive traces on a substrate of the integrated circuit to form an active trace layer, the active conductive traces each being arranged to electrically couple associated elements of the associated integrated circuit, there being gaps between adjacent ones of the active conductive traces;
   b) determining a standardized pattern density for a surface of the integrated circuit;
   c) forming a multiplicity of dummy raised lines on the substrate in the gaps based on the determined standardized pattern density, wherein the dummy raised lines are not arranged to electrically couple any elements in the integrated circuit;
   d) depositing an insulating layer over the active conductive traces to electrically insulate the active conductive traces, wherein the depositing of the insulating layer over the active conductive traces and the dummy raised lines serves to form raised areas in the insulating layer which have the determined standardized pattern density;
   e) spinning a layer of glass over the insulating layer to provide a planar surface on the wafer, the glass layer being superimposed over the active conductive traces and the dummy raised lines;
   f) etching the glass layer and portions of the insulating layer at a substantially uniform rate to expose at least portions of the insulating layer directly over the active conductive traces and the dummy raised lines; and
   whereby the standardized pattern density substantially reduces microloading.

2. A method as recited in claim 1 wherein the dummy raised lines are formed at least partially from elements selected from the group consisting of a multiplicity of dots, a multiplicity of blocks, and a multiplicity of line segments.

3. A method as recited in claim 1 wherein the dummy raised lines are formed from the same material as the active conductive traces and are applied at the same time as the active conductive traces, the insulating layer being arranged to cover the dummy raised lines in addition to the active conductive traces.

4. A method as recited in claim 3 wherein:
   the active conductive traces and the dummy raised lines are formed from a metallic material; and,
   the insulating layer is an oxide layer.

5. A method as recited in claim 1 wherein:
   the active trace layer is a first active trace layer; and,
   steps a) through e) are repeated to form a second active trace layer, wherein the second active trace layer has substantially the same determined standardized pattern density as the first active trace layer.

6. A method as recited in claim 1 wherein the active trace layer is a first active trace layer; and,
   steps a) through e) are repeated to form a plurality of subsequent active trace layers, wherein the subsequent active trace layers have substantially the same determined standardized pattern density as the first active trace layer.

7. A method as recited in claim 1 wherein the determined standardized pattern density is in the range of approximately 40% to 80% of the surface area of the substrate.

8. A method of fabricating an integrated circuit, the method comprising the steps of:
   a) forming a multiplicity of active conductive traces on a substrate of the integrated circuit to form an active trace layer, the active conductive traces each being arranged to electrically couple associated elements of the associated integrated circuit, there being gaps between adjacent ones of the active conductive traces;
   b) determining a standardized pattern density for a surface of the integrated circuit;
   c) depositing an insulating layer over the active conductive tracers and in the gaps to electrically insulate the active conductive traces, wherein the depositing of the insulating layer over the active conductive traces serves to form raised areas over the active conductive traces in the insulating layer;
   d) placing a mask over the insulating layer to define a pattern of lines in the gaps;
   e) etching the insulating layer to create dummy raised lines from the pattern of lines in the insulating layer that are formed over the gaps, wherein the dummy raised lines are electrically non-conductive and the raised areas formed over the active conductive traces have the determined standardized pattern density;
   f) spinning a layer of glass over the insulating layer to provide a planar surface on the substrate, the glass layer being superimposed over the active conductive traces and the dummy raised lines;
   g) etching the glass layer and portions of the insulating layer at a substantially unifrom rate to expose at least portions of the insulating layer directly over the active conductive traces and the dummy raised lines; and
   whereby microloading is reduced.

9. A method as recited in claim 8 wherein a photoresist material is used in the step of placing the mask over the insulating layer to define the pattern of lines, the method further comprising the step of removing the photoresist prior to the glass spinning step.

10. A method as recited in claim 8 wherein the insulating layer is an oxide layer.

11. A method of fabricating a plurality of distinct types of integrated circuits each distinct type of integrated circuits being on a distinct wafer, the method comprising the steps of:

a) forming a multiplicity of active conductive traces on a substrate of a selected wafer to form an active trace layer on the substrate, the active conductive traces each being arranged to electrically couple associated elements of the associated integrated circuit, there being gaps between adjacent ones of the active conductive traces;

b) determining a standardized pattern density for a surface of the distinct wafer;

c) forming a multiplicity of dummy raised lines on the substrate in the gaps, wherein the dummy raised lines are not arranged to electrically couple any elements in the integrated circuit;

d) depositing an insulating layer over the active conductive traces to electrically insulate the active conductive traces, wherein the depositing of the insulating layer over the active conductive traces and the dummy raised lines serves to form raised areas in the insulating layer which have the determined standardized pattern density;

e) spinning a layer of glass over the insulating layer to provide a planar surface on each of the substrates, the glass layer being superimposed over the active conductive traces and the dummy raised lines; and, f) etching the glass layer and portions of the insulating layer at a rate determined to expose at least portions of the insulating layer directing over the active conductive traces and the dummy raised lines; and g) repeating steps (a)–(e) for each of the distinct types of integrated circuits, whereby each of the distinct integrated circuits has substantially the same determined standardized pattern density to reduce microloading.

12. A method of fabricating a plurality of semiconductor wafers, each of which contains a distinct type of integrated circuit, wherein the plurality of integrated circuits contained by the plurality of semiconductor wafers are formed according to the method as recited in claim 11, wherein the determined standardized pattern density is substantially the same for the plurality of semiconductor wafers.

* * * * *